(12) United States Patent
Jung et al.

(10) Patent No.: US 10,738,813 B2
(45) Date of Patent: Aug. 11, 2020

(54) DISPLAY APPARATUS

(71) Applicant: Samsung Electronics Co., Ltd., Suwon-si (KR)

(72) Inventors: Sung Soo Jung, Suwon-si (KR); Dae Sung Ko, Seoul (KR); Song Hyeon Kim, Suwon-si (KR); Jun Pil Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 665 days.

(21) Appl. No.: 15/368,063

(22) Filed: Dec. 2, 2016

(65) Prior Publication Data
US 2017/0159687 A1 Jun. 8, 2017

(30) Foreign Application Priority Data

Dec. 4, 2015 (KR) .......... 10-2015-0171977

(51) Int. Cl.
F16B 5/07 (2006.01)
G02F 1/1333 (2006.01)
H05K 5/00 (2006.01)
H05K 5/02 (2006.01)
H05K 5/03 (2006.01)

(52) U.S. Cl.
CPC .......... *F16B 5/07* (2013.01); *G02F 1/133308* (2013.01); *H05K 5/0004* (2013.01); *H05K 5/0017* (2013.01); *H05K 5/0221* (2013.01); *H05K 5/03* (2013.01); *G02F 2001/13332* (2013.01); *G02F 2001/133314* (2013.01); *G02F 2001/133325* (2013.01); *G02F 2201/46* (2013.01); *G02F 2201/465* (2013.01)

(58) Field of Classification Search
CPC .. H05K 5/0004; H05K 5/0013; H05K 5/0017; H05K 5/0221; H05K 5/03; Y10T 403/60; Y10T 403/602; G02F 2201/465; G02F 2201/46

See application file for complete search history.

(56) References Cited

U.S. PATENT DOCUMENTS

| 8,179,496 B2 * | 5/2012 | Liou ........................ H04N 5/64 349/58 |
| 8,678,603 B2 * | 3/2014 | Zhang ............... G02F 1/133308 349/60 |
| 2016/0353592 A1 * | 12/2016 | Li ........................ H05K 5/0017 |

FOREIGN PATENT DOCUMENTS

| EP | 1 895 386 | * | 3/2008 | ............... G06F 1/16 |
| EP | 2 159 626 A | | 3/2010 | |
| KR | 10-2006-0051702 | * | 5/2006 | ............... G06F 1/16 |

OTHER PUBLICATIONS

European Office Action dated Sep. 14, 2018, in European Patent Application No. 16 202 006.9.

(Continued)

*Primary Examiner* — Michael P Ferguson
(74) *Attorney, Agent, or Firm* — Staas & Halsey LLP

(57) ABSTRACT

Disclosed herein is a display apparatus having an improved structure to improve an assembly performance of a product. The display apparatus includes a chassis disposed in a rear side of a display module to support the display module, a cover detachably coupled to the chassis and forming an appearance, a first coupling unit provided on one of the chassis and the cover and provided with a linear member having an elasticity, and a second coupling unit provided on the other of the chassis and the cover and detachably coupled to the first coupling unit.

9 Claims, 16 Drawing Sheets

(56) References Cited

OTHER PUBLICATIONS

Extended European Search Report dated Mar. 29, 2017 in corresponding European Application No. 16202006.9.
Korean Office Action dated Aug. 20, 2019 in corresponding Korean Patent Application No. 10-2015-0171977.
Communication pursuant to Article 94(3) EPC dated Feb. 26, 2020 in corresponding European Patent Application No. 16 202 006.9.

* cited by examiner

DISPLAY APPARATUS

CROSS-REFERENCE TO RELATED APPLICATIONS

This application claims the benefit of Korean Patent Application No. 10-2015-0171977, filed on Dec. 4, 2015 in the Korean Intellectual Property Office, the disclosure of which is incorporated herein by reference.

BACKGROUND

1. Field

Embodiments of the present disclosure relate to a display apparatus, more particularly, to a display apparatus having an improved structure to improve an assembly performance of a product.

2. Description of the Related Art

A display apparatus is a type of output apparatus configured to convert electrical information into visual information and to display the information to a user, and includes a television, a monitor and a variety of mobile terminals, e.g. smart phone and tablet PC.

The display apparatus includes a display apparatus using Cathode Ray Tube, a display apparatus using Light Emitting Diode, a display apparatus using Organic Light Emitting Diode, a display apparatus using Active-Matrix Organic Light Emitting Diode, a Liquid Crystal Display, or an electronic paper display apparatus.

A screw is typically used in a process of assembling components of a display apparatus. For example, the component of the display apparatus may include a variety of panels and chassis. When assembling the component of the display apparatus using the screw, an additional tool may be required for a coupling and thus the cost of the production may be increased. Further, a time for coupling of the screw may be required and thus the time of the production may be increased. In addition, as for the display apparatus, it may be required that a thickness of at least a height of the screw thread is secured for assembling components. Accordingly, it may be difficult to manufacture the display apparatus to be thin.

SUMMARY

Therefore, it is an aspect of the present disclosure to provide a display apparatus having an improved structure to allow a product to be easily assembled.

It is another aspect of the present disclosure to provide a display apparatus having an improved structure to allow a product to be thin.

Additional aspects of the disclosure will be set forth in part in the description which follows and, in part, will be obvious from the description, or may be learned by practice of the disclosure.

In accordance with an aspect of the present disclosure, there is provided a display apparatus including: a chassis configured to support a display module; a cover detachably coupled to the chassis; a first coupling unit provided on one of the chassis and the cover and provided with a linear member having an elasticity; and a second coupling unit provided on the other of the chassis and the cover and detachably coupled to the first coupling unit.

The first coupling unit may include a supporting part to support the linear member, wherein the linear member is elastically deformed by being supported by the supporting part.

The second coupling unit may include a coupling part detachably coupled to the linear member; and a detaching guide part configured to allow the coupling part to be easily detached from the linear member.

The supporting part may include a first supporting part to support the linear member in a direction opposite to a direction in which the linear member is elastically deformed due to coupling with the second coupling unit; a second supporting part to support the linear member in a direction opposite to a direction to which the second coupling unit is coupled; and a third supporting part to support the linear member in a direction opposite to a direction from which the second coupling unit is detached.

The linear member may include a coupling section in which the linear member and the second coupling unit are coupled to each other; and a supporting section in which the linear member is supported by the supporting part. The supporting part may be disposed on opposite sides with respect to the coupling section of the linear member, and the first supporting part is disposed in the farthest position from the coupling section.

The linear member may include a locking part to prevent the linear member from being detached in a longitudinal direction.

The first coupling unit may include a connector to which the locking part of the linear member is connected.

The linear member may include a locking part to prevent the linear member from being detached in a longitudinal direction, and the supporting part may include a connector to which the locking part of the linear member is connected.

The linear member may be disposed in upward and downward directions, and the detaching guide part is disposed on one side of the coupling part.

The linear member may be disposed in the left and right direction, and the detaching guide part is disposed on opposite sides of the coupling part.

The first coupling unit may include a through hole to allow the second coupling unit to be passed therethrough.

At least one of the first supporting part, the second supporting part and the third supporting part may be protruded from the chassis or the cover in which the first coupling unit is provided.

The first supporting part and the third supporting part may be integrally formed with each other.

The linear member may include a metal material, and the cover comprises a plastic material.

In accordance with an aspect of the present disclosure, there is provided a display apparatus including: a chassis configured to support a display module and provided with at least one wire; and a cover provided with a plurality of hooks detachably coupled to the at least one wire.

The chassis may include a plurality of supporting parts to support the at least one wire. The plurality of supporting parts may be provided on an edge of the chassis and the plurality of hooks may be provided on an edge of the cover.

The plurality of supporting parts may be provided on at least two sides among four sides of the edge of the chassis formed in a square or rectangular shape.

The plurality of supporting parts may be provided on an upper side, a left side and a right side among four sides of the edge of the chassis, and the plurality of hooks may be provided on an upper side, a left side and a right side among four sides of the edge of the cover.

The hook may include a detaching guide part to allow the hook to be easily detached from the wire. The hook provided on the upper side of the edge of the chassis may include the detaching guide part on both sides of the hook disposed in the left and right direction, and the hook provided on the left and right side of the edge of the chassis may include the detaching guide part on the lower side of the hook disposed in the upper and lower direction.

The at least one wire may include a locking part to prevent the wire from being detached in a longitudinal direction, and the chassis may include a connector to which the locking part is connected.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
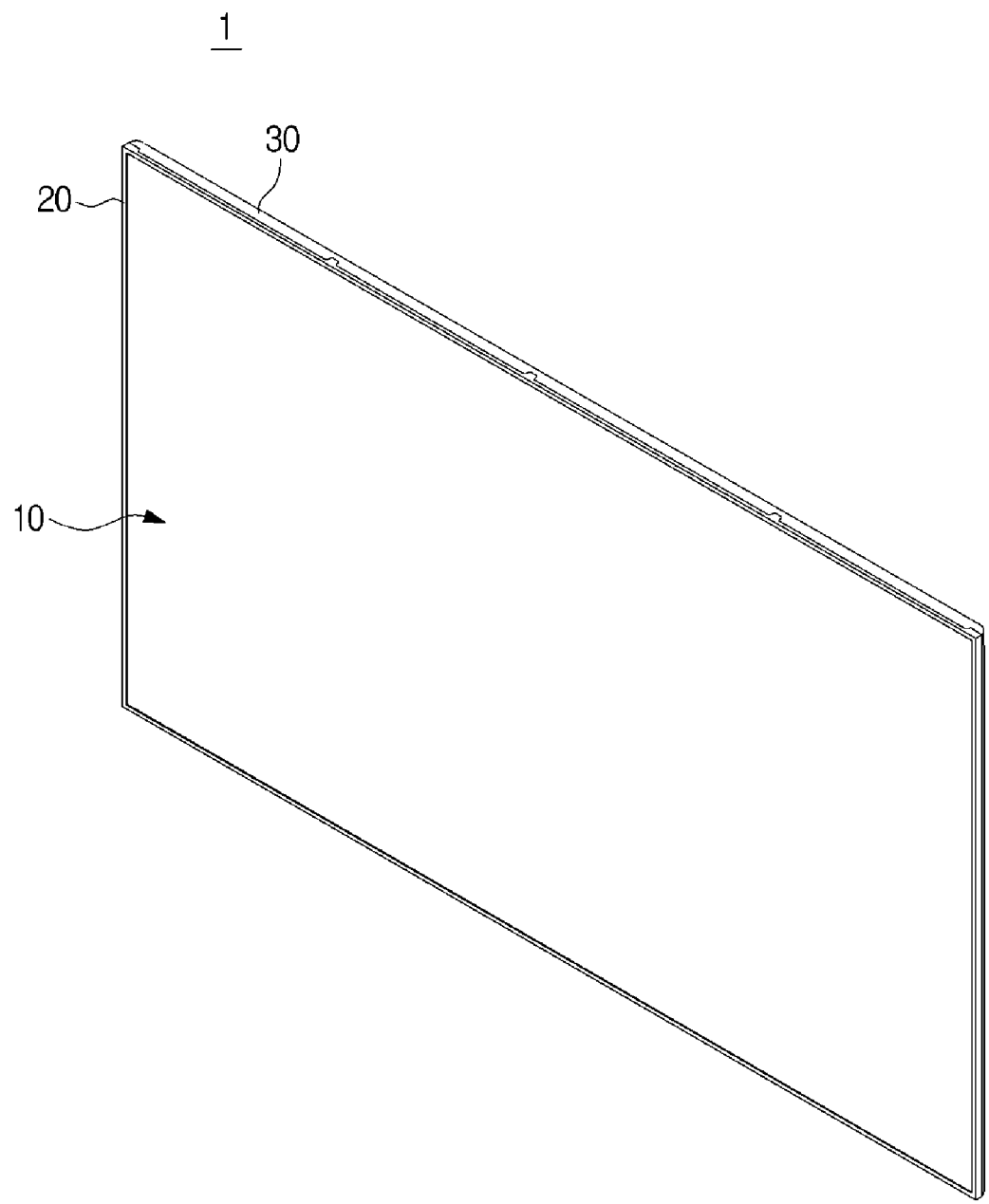
FIG. 1 is perspective view illustrating a display apparatus according to an embodiment of the present disclosure.

The present disclosure will be described more fully hereinafter with reference to the accompanying drawings, in which exemplary embodiments of the present disclosure are shown. As those skilled in the art would realize, the described embodiments may be modified in various different ways, all without departing from the spirit or scope of the present disclosure.

Parts which are not associated with the description are omitted in order to specifically describe the present disclosure, and like reference numerals refer to like elements throughout the specification The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, but elements are not limited by these terms. These terms are only used to distinguish one element from another element. For example, without departing from the scope of the present disclosure, a first element may be termed as a second element, and a second element may be termed as a first element. The term of "and/or" includes a plurality of combinations of relevant items or any one item among a plurality of relevant items.

Hereinafter embodiments of the present disclosure will be described with reference to drawings. In the following detailed description, the terms of "upper side", "lower side", "left side", "right side", "horizontality", "verticality" and the like may be defined by the drawings, but the shape and the location of the component is not limited by the term.

Hereinafter the present disclosure will be described more fully hereinafter with reference to the accompanying drawings, in which exemplary embodiments of the disclosure are shown. A flat display apparatus is described as an example of one embodiment of the present disclosure, but is not limited thereto. A display apparatus may include a curved display apparatus, and a bendable or flexible display apparatus configured to be variable into a curved status and a flat status.

Figure 2:
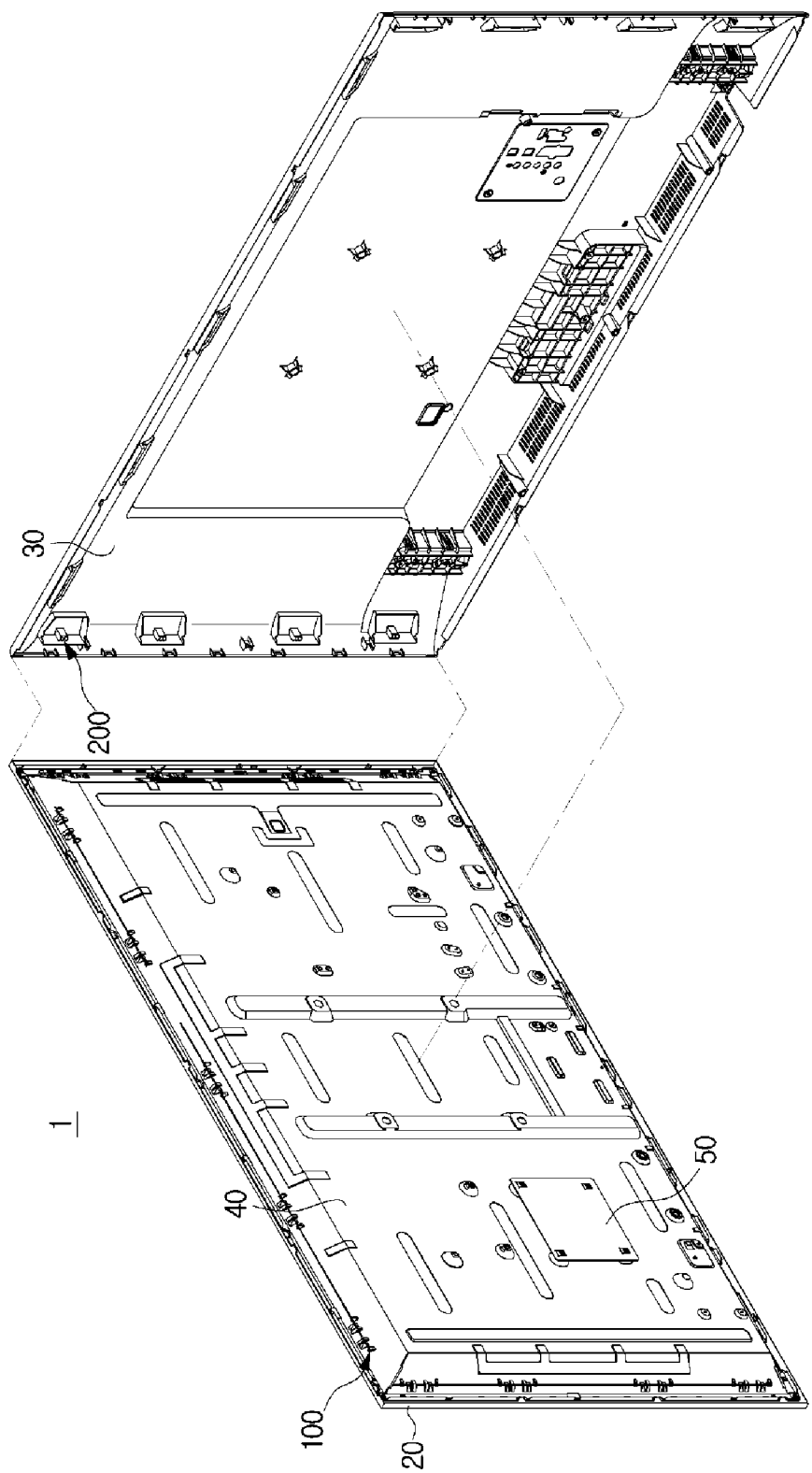
FIG. 2 is a view illustrating a state in which a rear cover and a chassis are separated from each other in the display apparatus according to an embodiment of the present disclosure.

FIG. 1 is perspective view illustrating a display apparatus according to an embodiment of the present disclosure and FIG. 2 is a view illustrating a state in which a rear cover and a chassis are separated from each other in the display apparatus according to an embodiment of the present disclosure.

As illustrated in FIG. 1, a display apparatus 1 may include a display module 10 having a flat plate shape, and a front cover 20 forming an edge of a front surface and a side appearance of the display apparatus 1.

The display module 10 may include a display panel in which an image is displayed; and a backlight unit. The backlight unit may include a light source and an optical member, e.g. a light guide plate. That is, the display module 10 may be an edge lit-backlight unit and thus may include a light source provided in a rear side of a display panel and a light guide plate provided to guide the light emitted from the light source to the display panel. The light guide plate may convert the light emitted from the light source into a surface light source to allow the light to face the display panel.

The backlight unit may further include an optical member, e.g. a sheet member. The sheet member may include an optical sheet having optical properties and a quantum dot (QD) sheet improving the color reproducibility.

As illustrated in FIG. 2, the display apparatus 1 may include a chassis 40 to support the display module 10. The chassis 40 may be disposed to support the display module 10. The chassis 40 may include a first chassis (not shown) and a second chassis 40 disposed in a rear side of the first chassis.

In other words, the first chassis may be disposed on at least one of a front side and a lateral side of the display module 10. For example, the first chassis may be disposed to cover a part of the front surface of the display module 10. Alternatively, the first chassis may be disposed to cover the lateral surface of the display module 10. Further, the first chassis may be disposed to cover a part of the front surface and the lateral surface of the display module 10. The second chassis 40 may be disposed on at least one of the lateral side and a rear side of the display module 10. The second chassis 40 may be disposed on the rear side of the display module 10.

Particularly, when the first chassis is disposed to cover a part of the front surface of the display module 10, the second chassis 40 may be disposed in the lateral and rear side of the display module 10. When the first chassis is disposed to cover the lateral side of the display module 10, the second chassis 40 may be disposed in the rear side of the display module 10.

When the first chassis is disposed to cover a part of the front surface and the lateral surface of the display module 10, the second chassis 40 may be disposed in the rear side of the display module 10. The first chassis and the second chassis 40 may be coupled to each other to support the display module 10. The first chassis and the second chassis 40 may be integrally formed with each other to support the display module 10.

The display apparatus 1 may include at least one printed circuit board 50 electrically connected to the display module 10. Referring to FIG. 2, the at least one printed circuit board 50 may be mounted to the chassis 40.

The at least one printed circuit board 50 may include a power substrate, a signal processing substrate and a driving substrate. Particularly, a circuit element configured to supply the power to the display module 10 may be disposed on the power substrate. A circuit element configured to receive and process an external signal may be disposed on the signal processing substrate. The driving substrate may be disposed to drive the display module 10. The power substrate, the signal processing substrate and the driving substrate may be individually disposed or disposed to be merged with each other.

As illustrated in FIG. 2, the display apparatus 1 may include a rear cover 30 forming an appearance of a rear side of the display apparatus 1. The rear cover 30 may be disposed in the rear side of the second chassis 40 to face the second chassis 40. The rear cover 30 may be disposed in the rear side of the second chassis 40 to cover at least one part of the second chassis 40. The rear cover 30 may be detachably coupled to the second chassis 40.

Hereinafter a structure configured to mount the rear cover 30 to the second chassis 40 will be described with reference to the drawings. A wire described in following may correspond to a linear member 110 and a hook may correspond to a second coupling unit 200.

Figure 3:
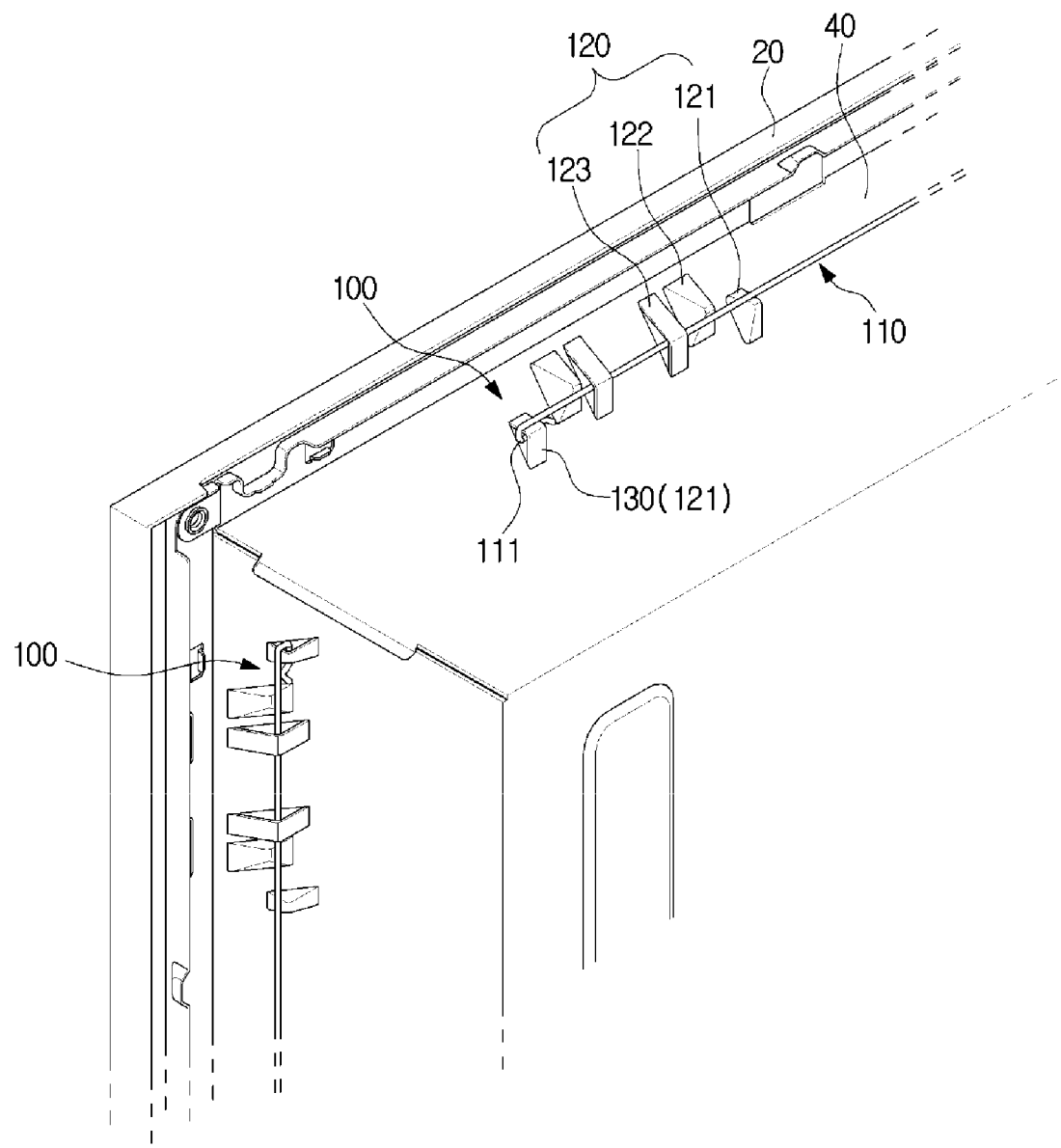
FIG. 3 is a partial enlarged view illustrating a chassis in the display apparatus according to an embodiment of the present disclosure.
Figure 4:
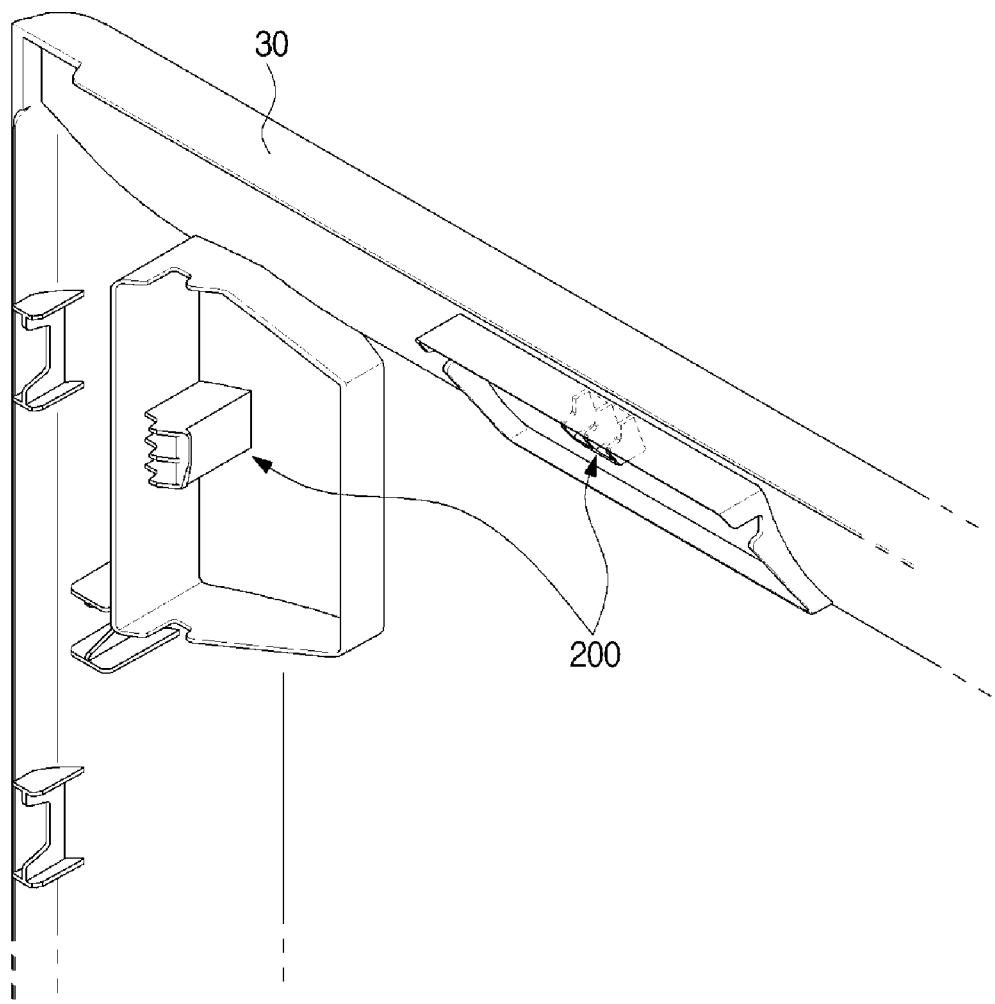
FIG. 4 is a partial enlarged view illustrating a cover in the display apparatus according to an embodiment of the present disclosure.
Figure 5:
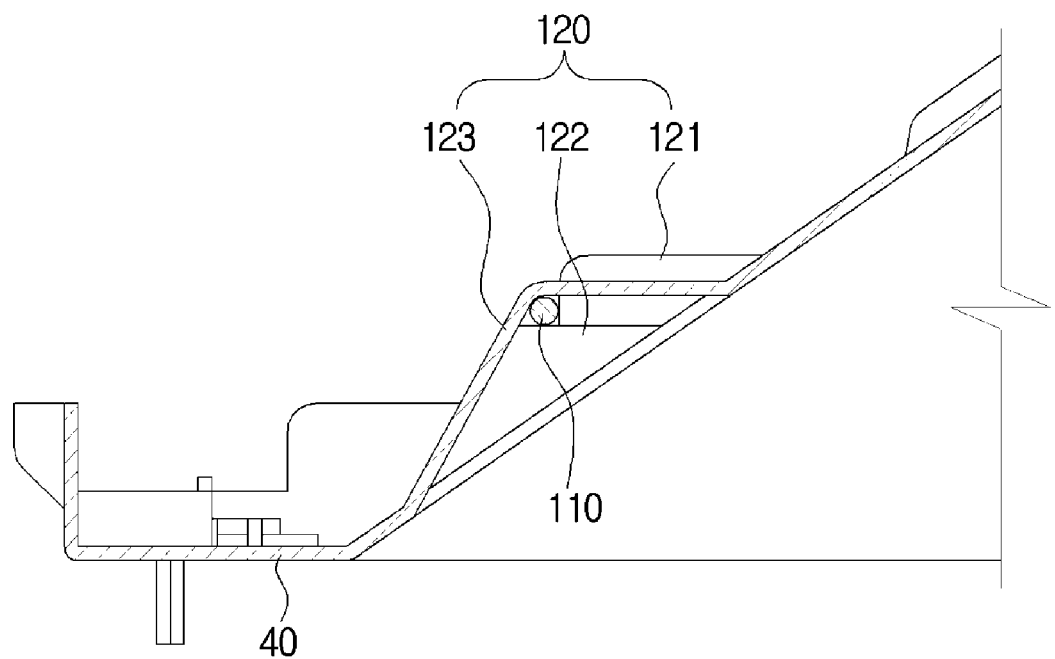
FIG. 5 is a partial cross-sectional view illustrating the chassis shown in FIG. 3.
Figure 6:
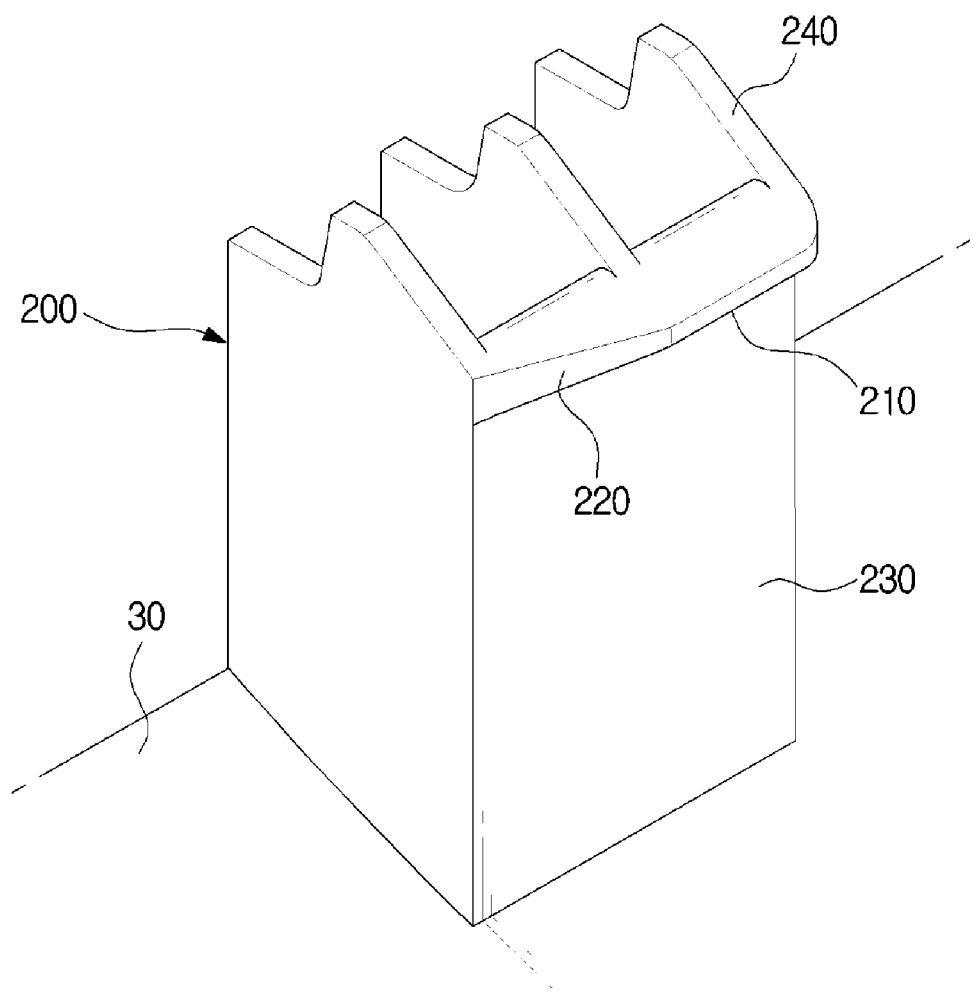
FIG. 6 is a view illustrating a hook in the cover shown in FIG. 4.
Figure 7:
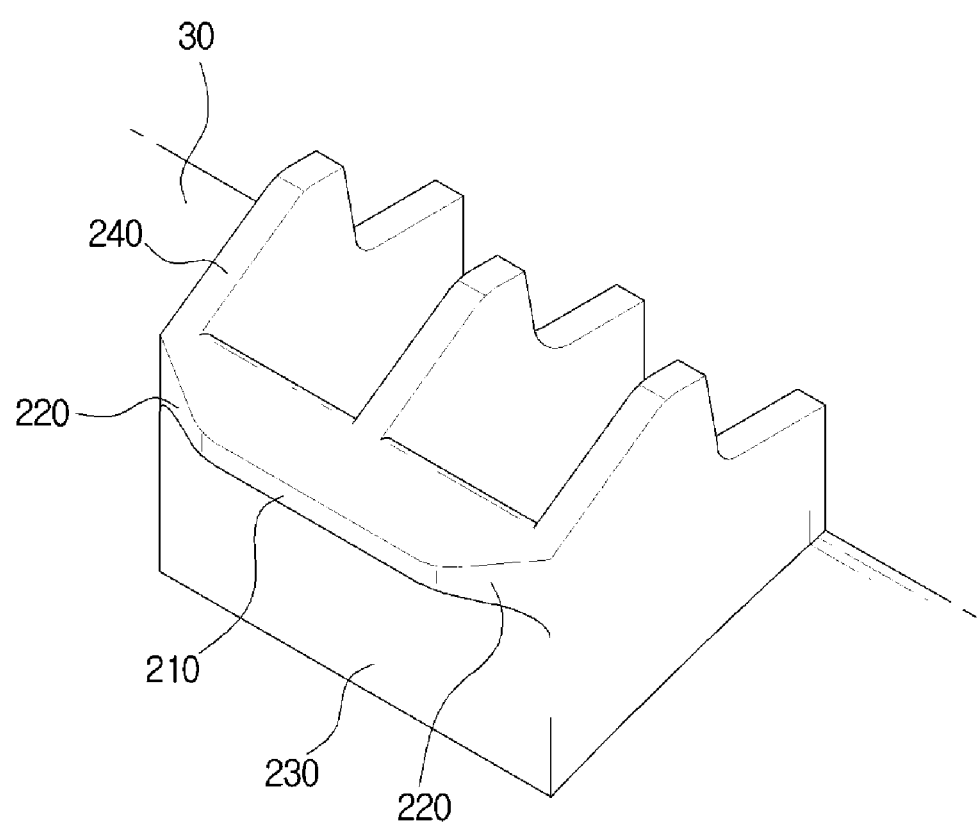
FIG. 7 is a view illustrating another hook in the cover shown in FIG. 4.

FIG. 3 is a partial enlarged view illustrating a chassis in the display apparatus according to an embodiment of the present disclosure, and FIG. 4 is a partial enlarged view illustrating a cover in the display apparatus according to an embodiment of the present disclosure. FIG. 5 is a partial cross-sectional view illustrating the chassis shown in FIG. 3, FIG. 6 is a view illustrating a hook in the cover shown in FIG. 4, and FIG. 7 is a view illustrating another hook in the cover shown in FIG. 4.

As illustrated in FIGS. 3 and 4, the display apparatus 1 may further include a first coupling unit 100. Further, the display apparatus 1 may further include a second coupling unit 200 detachably coupled to the first coupling unit 100.

The first coupling unit 100 may be provided on any one of the chassis 40 and the cover 30. The second coupling unit 200 may be provided on the other of the chassis 40 and the cover 30 to correspond to the first coupling unit 100.

The first coupling unit 100 may include the linear member 110 having the elasticity. The linear member 110 having the elasticity may include a wire made of metal material. In addition, the first coupling unit 100 may include a supporting part 120 configured to support the linear member 110.

The second coupling unit 200 may include a coupling part 210 detachably coupled to the linear member 110. In addition, the second coupling unit 200 may include a detaching guide part 220 configured to allow the coupling part 210 to be easily detached from the linear member 110.

In a state in which the first coupling unit 100 and the second coupling unit 200 are already coupled to each other or during the first coupling unit 100 and the second coupling unit 200 are coupled to each other, the linear member 110 of the first coupling unit 100 may be compressed by the second coupling unit 200 and supported by the supporting part 120 of the first coupling unit 100 thereby being elastically deformed.

The supporting part 120 may be integrally formed with any one of the chassis 40 and the cover 30 in which the first coupling unit 100 is provided. The second coupling unit 200 may be integrally formed with the other of the chassis 40 and the cover 30.

Hereinafter a case in which the first coupling unit 100 is provided in the chassis 40 and the second coupling unit 200 is provided in the cover 30 will be described as an example.

The first coupling unit 100 may be provided along an edge of the chassis 40. The first coupling unit 100 may be provided in plural, and a plurality of the first coupling unit 100 may be apart from each other. Some or all of the plurality of the first coupling unit 100 may be detachably coupled to the second coupling unit 200 provided in the cover 30. However, the arrangement of the plurality of the first coupling unit 100 is not limited thereto, and thus it may be modified.

Particularly, the supporting part 120 of the first coupling unit 100 may be provided in plural and a plurality of the supporting part 120 may be apart from each other along the edge of the chassis 40. One or more linear member 110 of the first coupling unit 100 may be provided and a single linear member 110 may be supported by the plurality of the supporting part 120.

The linear member 110 may include a coupling section in which the linear member 110 is coupled to the second coupling unit 200 and a supporting section the linear member 110 is supported by the supporting part 120, wherein the linear member 110 supported by the plurality of the supporting part 120 may include a plurality of coupling sections and a plurality of supporting sections. The supporting part 120 and the supporting section may be disposed on opposite sides with respect to the coupling section of the linear member 110.

When the display apparatus 1 is formed in a square or rectangular shape, the first coupling unit 100 may be provided on at least two sides among four sides of the edge of the chassis 40 formed in a square or rectangular shape. The first coupling unit 100 may be provided on three sides, e.g. an upper side, a left side and a right side, among the four sides of the edge of the chassis 40. The second coupling unit 200 may be provided on three sides, e.g. an upper side, a left side and a right side, among the four sides of the edge of the cover 30 to correspond to the position of the first coupling unit 100. Since the chassis 40 is detachably coupled to the cover 30 through the three sides in the four sides of the edge, a coupling force higher than a certain level may be secured and the chassis 40 and the cover 30 may be easily separated through a side in which the chassis 40 and the cover 30 is not coupled to each other. The detaching guide part 220 provided in the second coupling unit 200 for the easy detachment of the cover 30 will be described later.

The supporting part 120 of the first coupling unit 100 may include a first supporting part 121 supporting the linear member 110 in a direction opposite to a direction in which the linear member 110 is elastically deformed due to the coupling with the second coupling unit 200. The supporting part 120 of the first coupling unit 100 may include a second supporting part 122 supporting the linear member 110 in a direction opposite to a direction to which the second coupling unit 200 is coupled. In addition, the supporting part 120 of the first coupling unit 100 may include a third supporting part 123 supporting the linear member 110 in a direction opposite to a direction from which the second coupling unit 200 is separated after the second coupling unit 200 is coupled.

When a coupling direction of the first coupling unit 100 and the second coupling unit 200 is defined as a vertical direction, the second coupling unit 200 may compress the linear member 110 from one side of the linear member 110 to a horizontal direction that is perpendicular to the coupling direction of the first coupling unit 100 and the second coupling unit 200, due to the coupling of the linear member 110 and the second coupling unit 200. In this time, the linear member 110 may be elastically deformed by the first supporting part 121 and then compress the second coupling unit 200 by the restoring force.

Further, when the coupling direction of the first coupling unit 100 and the second coupling unit 200 is defined as a vertical direction, the second supporting part 122 may support the linear member 110 so that the elastic deformation of the linear member 110 in a vertically downward direction is not large during the linear member 110 and the second coupling unit 200 are coupled to each other. The third supporting part 123 may support the linear member 110 so that the elastic deformation of the linear member 110 in a vertically upward direction is not large after the linear member 110 and the second coupling unit 200 are coupled to each other.

As mentioned above, the elastic deformation of the linear member 110 should not be excessive in the vertically up and downward direction in which the first coupling unit 100 and the second coupling unit 200 are coupled to each other, and the elastic deformation of the linear member 110 may be needed to be sufficient. Accordingly, in comparison with the second supporting part 122 and the third supporting part 123, the first supporting part 121 may be needed to be disposed in the farthest position from the coupling section of the linear member 110 to which the second coupling unit 200 is coupled.

Although not shown in the drawings, at least two supports units of the first supporting part 121, the second supporting part 122 and the third supporting part 123 may be integrally formed with each other.

Referring to FIG. 3, the linear member 110 may include a locking part 111 so that the linear member 110 is prevented from being separated from the chassis 40 in a longitudinal direction of the linear member 110. The locking part 111 may be provided on one end portion in the longitudinal direction of the linear member 110, and formed such that the linear member 110 is bent. When the linear member 110 is coupled to the chassis 40 in an upper and lower side, the locking part 111 may be needed to be provided on an upper end portion of the linear member 110.

The first coupling unit 100 may include a connector 130 to which the locking part 111 of the linear member 110 is coupled. The connector 130 may be provided together with the supporting part 120 of the first coupling unit 100. The connector 130 may be needed to be formed with the first supporting part 121 provided on the most outside among the first supporting part 121, the second supporting part 122 and the third supporting part 123. The supporting parts 121, 122 and 123, in which the connector 130 is not provided, may include a misassembling prevention surface 131 (refer to FIG. 8) to prevent a misassembling of the linear member 110.

When a single linear member 110 is supported by the plurality of the supports 120, the connector 130 may be provided only the first coupling unit 100 supporting the end portion of the linear member 110 in which the locking part 111 is provided, or alternatively may be provided in the chassis 40 aside from the first coupling unit 100.

Referring to FIGS. 3 to 5, an edge portion of the chassis 40 may be an inclined surface. The first coupling unit 100 may be protruded from the inclined surface of the chassis 40. Particularly, the first supporting part 121, the second supporting part 122 and the third supporting part 123 may be formed to be protruded from the inclined surface of the chassis 40.

As illustrated in FIG. 5, the first supporting part 121 may be protruded to support the left side or the right side of the linear member 110, and the second supporting part 122 may be protruded to support the lower side of the linear member 110. In addition, the third supporting part 123 may be protruded from the chassis 40, and may have a shape allowing the linear member 110 to be passed therethrough, so as to support the upper side of the linear member 110.

Referring to FIGS. 4, 6, and 7, the second coupling unit 200 may be protruded from an inner side surface of the cover 30. FIG. 6 is an enlarged view illustrating the second coupling unit 200 provided in the left side or the right side of the cover shown in FIG. 4, and FIG. 7 is an enlarged view illustrating the second coupling unit 200 provided in the upper side of the cover shown in FIG. 4.

The second coupling unit 200 may be formed in a hook shape. The second coupling unit 200 may include a body 230 extended from the cover 30 and a coupling part 210 extended from one surface of the body 230. When the second coupling unit 200 is coupled to the first coupling unit 100, the body 230 may compress the linear member 110 of the first coupling unit 100 to the lateral side and the coupling part 210 may prevent the second coupling unit 200 from being detached from the first coupling unit 100.

As illustrated in FIGS. 6 and 7, in an upper end of the body 230, i.e. an end portion in a direction in which the second coupling unit 200 is coupled to the first coupling unit 100, the second coupling unit 200 may include a coupling guide surface 240 configured to enable the second coupling unit 200 to be easily coupled to the linear member 110 of the first coupling unit 100 while deforming the linear member 110 of the first coupling unit 100. The coupling guide surface 240 may be an inclined surface with respect to the coupling direction. A length of the coupling guide surface 240 may be longer than a certain length in consideration with a contraction and expansion of the cover 30.

Further, the second coupling unit 200 may include the detaching guide part 220 configured to allow the coupling part 210 to be easily detached from the linear member 110. The detaching guide part 220 may be disposed on a single side or both sides of the coupling part 210, and may be formed such that a protrusion height is reduced from the most protruded surface of the coupling part 210 to one surface of the body 230 in which the coupling part 210 is protruded.

As mentioned above, when the display apparatus 1 is formed in the square or rectangular shape, the first coupling unit 100 may be provided on three sides, e.g. an upper side, a left side and a right side, among the four sides of the edge of the chassis 40, and the second coupling unit 200 may be provided on three sides, e.g. an upper side, a left side and a right side, among the four sides of the edge of the cover 30 to correspond to the position of the first coupling unit 100.

The second coupling unit 200, in which the detaching guide part 220 is disposed on one side of the coupling part 210 shown in FIG. 6, may be needed to be disposed on the left edge and the right edge of the cover 30, and the second coupling unit 200, in which the detaching guide part 220 is disposed on opposite sides of the coupling part 210 shown in FIG. 7, may be needed to be disposed on the upper edge of the cover 30.

The second coupling unit 200 shown in FIG. 6 may be disposed in the left and right edge of the cover 30 in the upper and lower direction so that the detaching guide part 220 is toward the lower side of the cover 30, and thus the cover 30 may be easily separated from the lower side that is not coupled to the chassis 40.

In addition, the second coupling unit 200 shown in FIG. 7 may be disposed in the upper edge of the cover 30 in the left and right direction and thus the upper edge of the cover 30 may be easily separated from the chassis 40 after the left and right edge of the cover 30 is separated from the chassis 40.

Hereinafter a state in which the first coupling unit 100 and the second coupling unit 200 are coupled to each other will be described.

Figure 8:
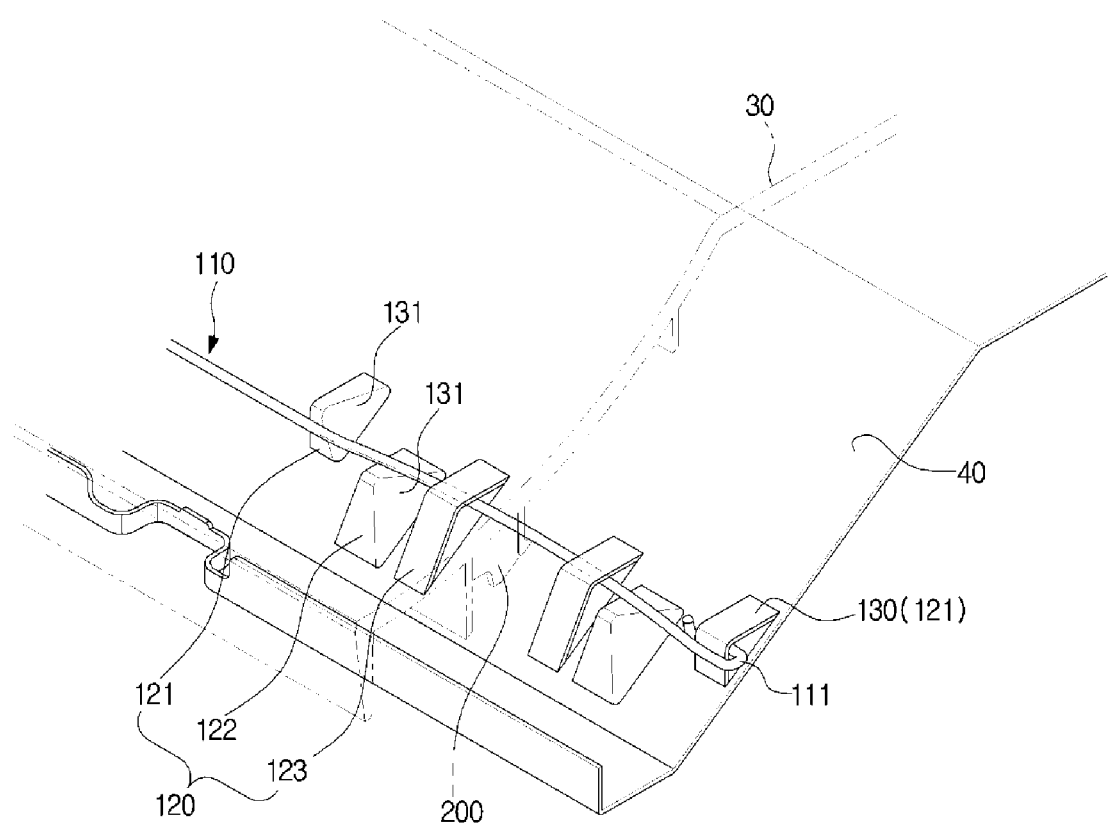
FIG. 8 is a view illustrating a state in which the chassis and the cover are coupled to each other in the display apparatus according to an embodiment of the present disclosure.
Figure 9:
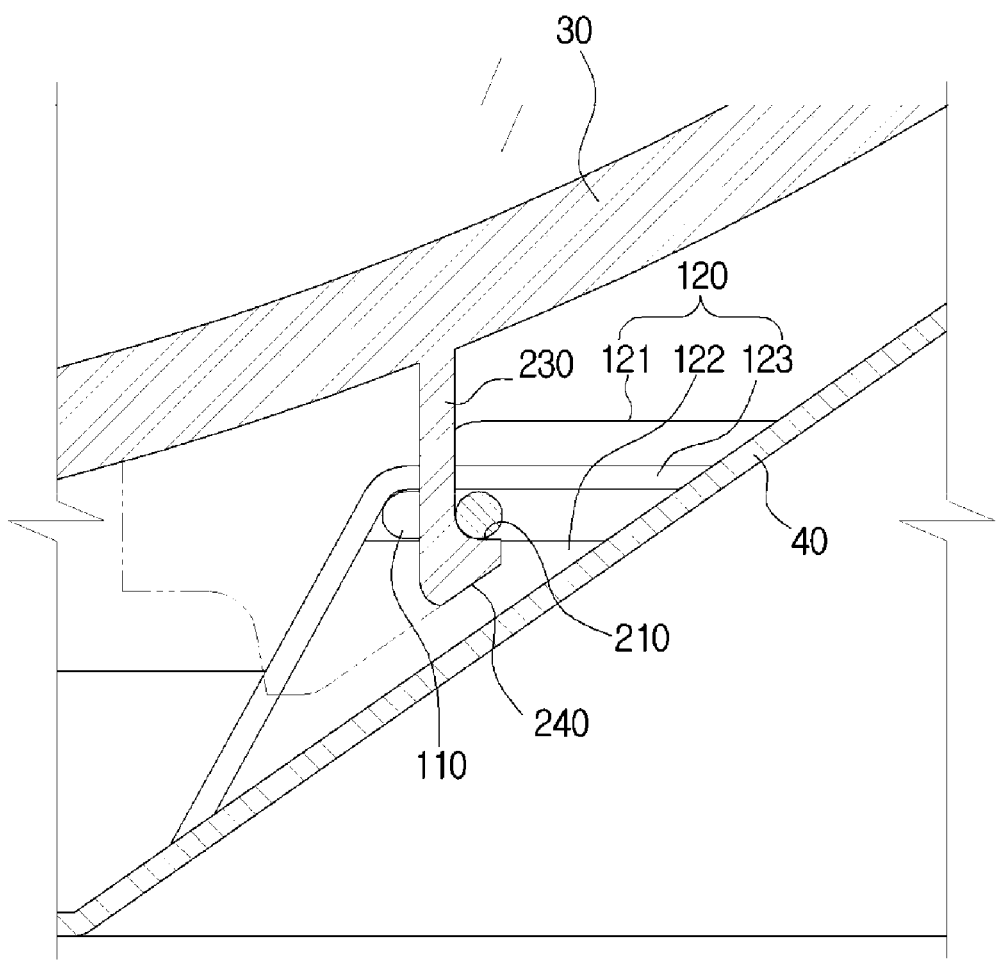
FIG. 9 is a partial cross-sectional view illustrating the chassis and the cover shown in FIG. 8.

FIG. 8 is a view illustrating a state in which the chassis and the cover are coupled to each other in the display apparatus according to an embodiment of the present disclosure, and FIG. 9 is a partial cross-sectional view illustrating the chassis and the cover shown in FIG. 8.

As illustrated in FIGS. 8 and 9, in a state in which the first coupling unit 100 and the second coupling unit 200 are already coupled to each other, the linear member 110 may be maintained to be elastically deformed by the second coupling unit 200. The restoring force of the linear member 110 may provide a coupling force so that the second coupling unit 200 is not separated from the first coupling unit 100.

The second coupling unit 200 may be disposed to compress the linear member 110 from the outside to the inside of the chassis 40, or from the inside to the outside of the chassis 40.

As illustrated in FIGS. 8 and 9, in a state in which the second coupling unit 200 is disposed to compress the linear member 110 from the outside to the inside of the chassis 40, when the center portion of the cover 30 is not completely attached to the chassis 40 by an external force, the coupling force between the cover 30 and the chassis 40 may be improved.

Although not shown in the drawings, in a state in which the second coupling unit 200 is disposed to compress the linear member 110 from the inside to the outside of the chassis 40, when the cover 30 is separated from the lower side, according to the above mentioned description, the second coupling unit 200 may be easily separated from the first coupling unit 100 by lifting the center of the lower end of the cover 30.

Hereinafter in consideration with the contraction and the expansion, the configuration of the first coupling unit 100 and the second coupling unit 200 will be described.

Figure 10:
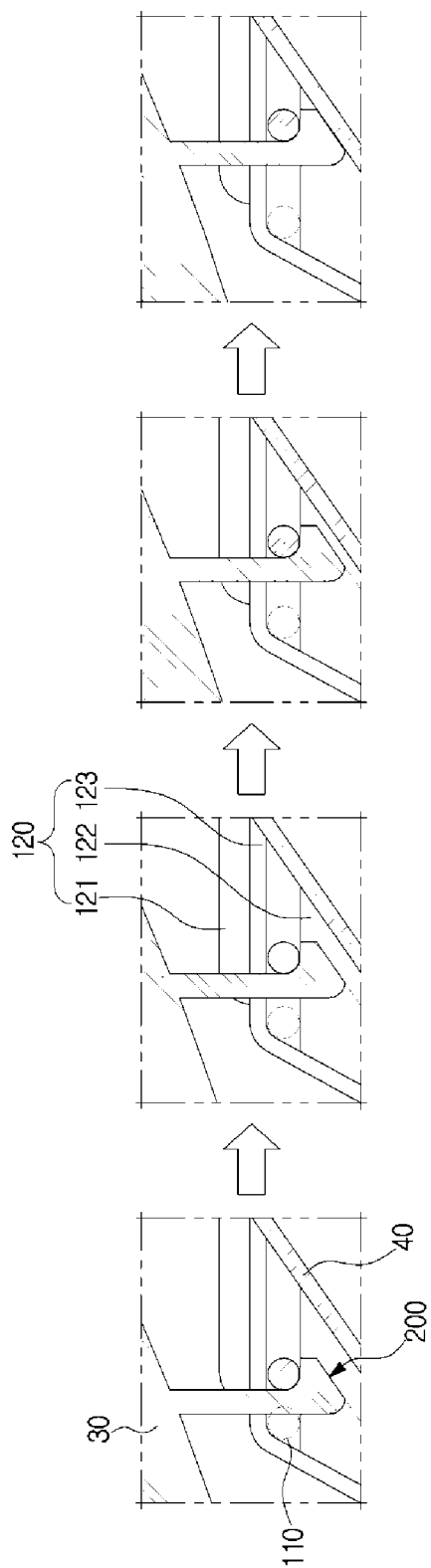
FIG. 10 is a view illustrating a change in a coupling portion in which a wire and a hook are coupled to each other, when the cover is contracted.
Figure 11:
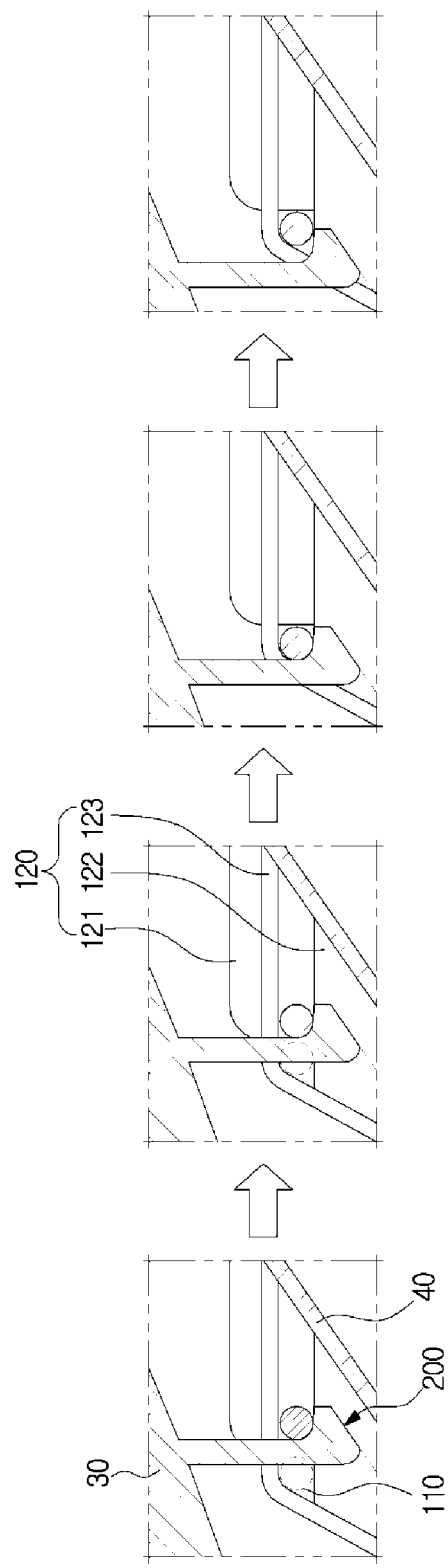
FIG. 11 is a view illustrating a change in the coupling portion in which the wire and the hook are coupled to each other, when the cover is expanded.
Figure 12:
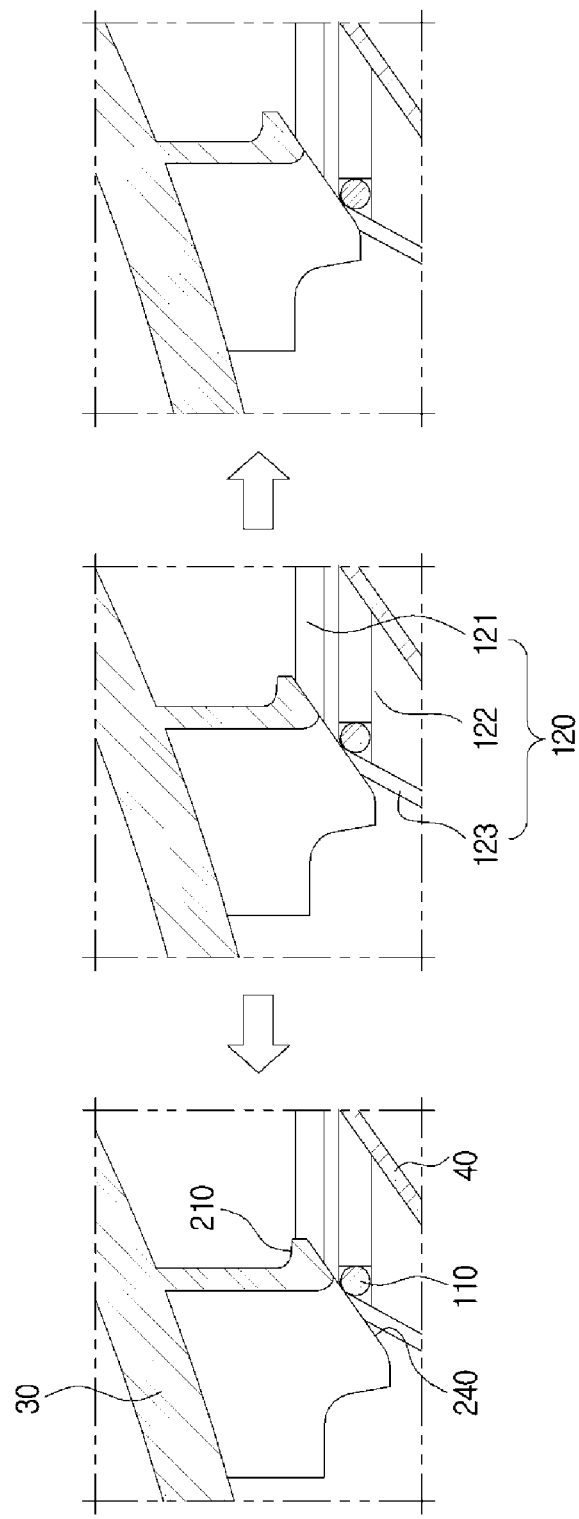
FIG. 12 is a view illustrating a configuration of the hook to correspond to the contraction and expansion of the cover.

FIG. 10 is a view illustrating a change in a coupling portion in which a wire and a hook are coupled to each other, when the cover is contracted, and FIG. 11 is a view illustrating a change in the coupling portion in which the wire and the hook are coupled to each other, when the cover is expanded. FIG. 12 is a view illustrating a configuration of the hook to correspond to the contraction and expansion of the cover.

According to one embodiment of the present disclosure, the physical properties of components of the display apparatus 1 may be changed by the change in the environment e.g. change in a temperature. The chassis 40 may be formed of a material that is relatively less contracted and expanded according to the change in the temperature in comparison with the cover 30, and the cover 30 may be formed of a material that is relatively more contracted and expanded according to the change in the temperature in comparison with the chassis 40.

For example, the chassis 40 may be formed of a material including a metal material, and the cover 30 may be formed of a material including a plastic material. In addition, the supporting part 120 of the first coupling unit 100 may be formed of a material including a metal material, and the second coupling unit 200 may be formed of a material including a plastic material.

Referring to FIG. 10, it may be noticed that the coupling state of the first coupling unit 100 and the second coupling unit 200 is changed according to the contraction of the cover 30. According to the contraction of the cover 30, the position of the second coupling unit 200 may be moved in a direction in which the second coupling unit 200 compresses the linear member 110. Therefore, the displacement of the elastic deformation of the linear member 110 may be increased and the restoring force may be also increased.

When the restoring force of the linear member 110 is increased, the coupling force between the first coupling unit 100 and the second coupling unit 200 may be more increased, and thus a possibility in which the cover 30 is arbitrarily separated from the chassis 40 due to the contraction of the cover 30, may be reduced. Further, the linear member 110 may be formed of a material including a material that is easily elastically deformed, and thus it may be prevented that the first coupling unit 100 and the second coupling unit 200 are damaged due to the contraction of the cover 30.

Referring to FIG. 11, it may be noticed that the coupling state of the first coupling unit 100 and the second coupling unit 200 is changed according to the expansion of the cover 30. According to the expansion of the cover 30, the position of the second coupling unit 200 may be moved in a direction in which the linear member 110 is restored. Therefore, according to the expansion of the cover 30, the displacement of the elastic deformation of the linear member 110 may be reduced and the restoring force may be also reduced.

Although the cover 30 is in an initial state in which the cover 30 is not expanded, the linear member 110 may be elastically deformed, and thus the restoring force of the linear member 110 may be maintained unless the cover 30 is expanded as much as the second coupling unit 200 is moved by more than the displacement of the elastically deformed linear member 110. Although the cover 30 is expanded as much as the second coupling unit 200 is moved by more than the displacement of the elastically deformed linear member 110, the coupling state between the first coupling unit 100 and the second coupling unit 200 may be maintained until the linear member 110 of the second coupling unit 200 is separated from the coupling part 210.

Referring to FIG. 12, although the position of the second coupling unit 200 is moved due to the contraction and expansion of the cover 30 or an error generated in the manufacturing, before the first coupling unit 100 and the second coupling unit 200 are coupled to each other, the first coupling unit 100 may be easily coupled to the second coupling unit 200 due to the elastic deformation of the linear member 110, as long as the linear member 110 is not escaped from a range of the coupling guide surface 240 of the second coupling unit 200.

As mentioned above, in the assembly process of the components of the display apparatus 1, it may be prevented that the assembly of the components becomes difficult due to the physical properties of components changed by the change in the environment, e.g. change in a temperature, by using the first coupling unit 100 including the linear member 110 and the second coupling unit 200 including the coupling part 210 and the coupling guide surface 240.

Hereinafter a first coupling unit according to another embodiment of the present disclosure will be described.

Figure 13:
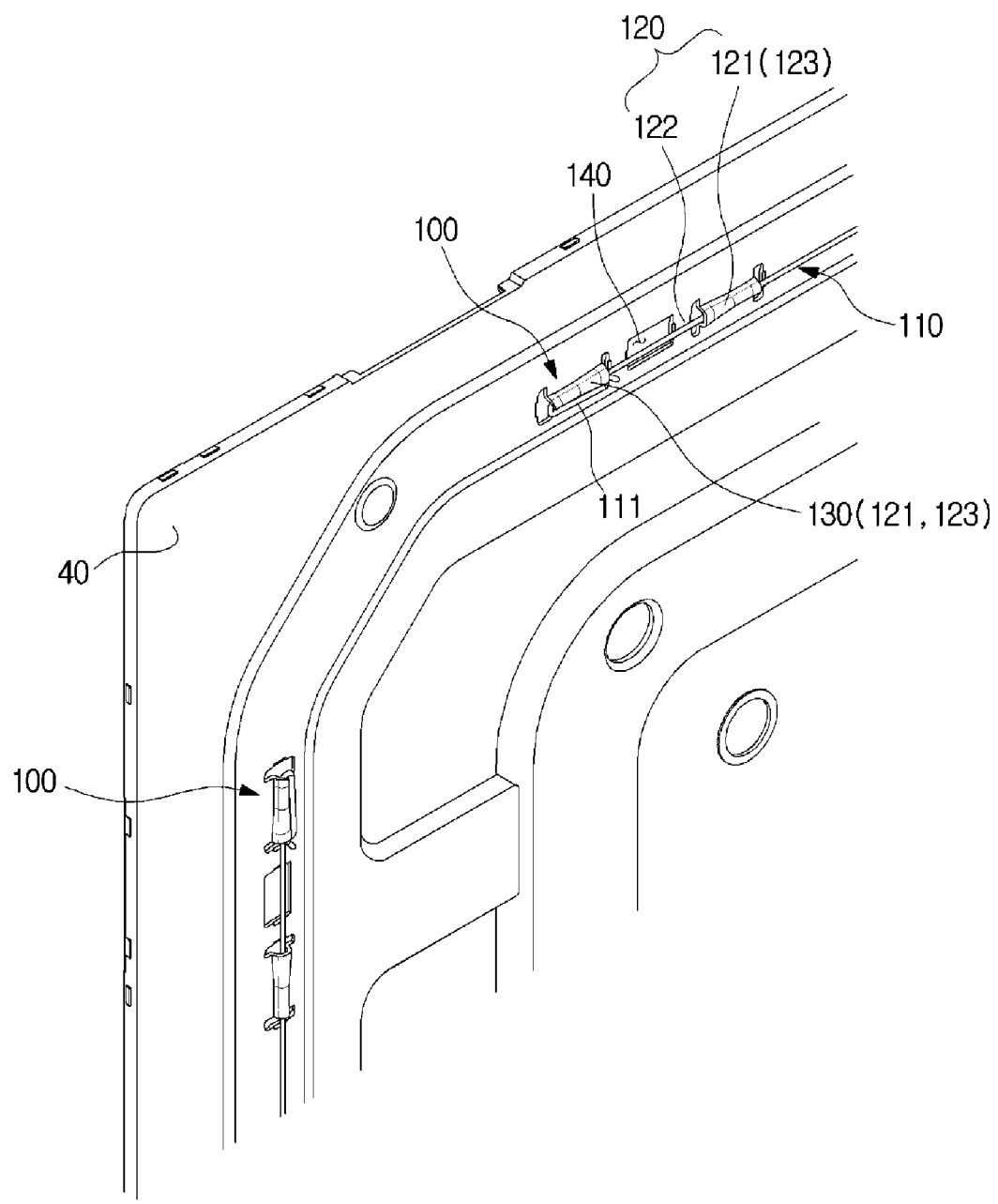
FIG. 13 is a partial enlarged view illustrating a chassis in a display apparatus according to another embodiment of the present disclosure.
Figure 14:
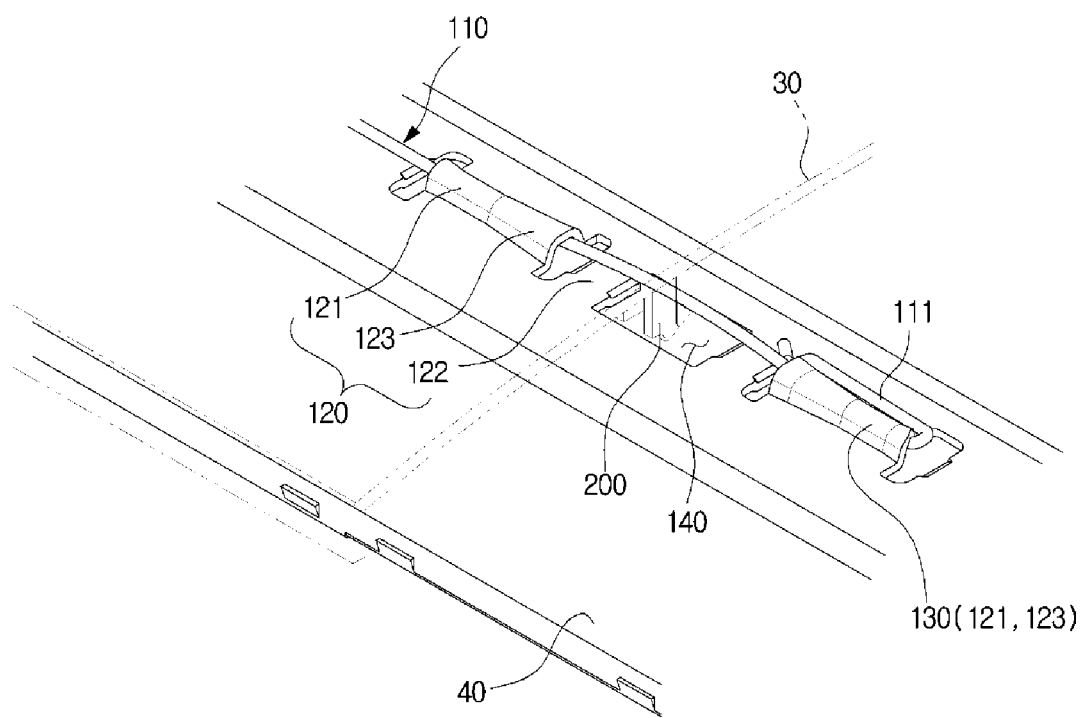
FIG. 14 is a view illustrating a state in which a cover is coupled to the chassis show in FIG. 13.

FIG. 13 is a partial enlarged view illustrating a chassis in a display apparatus according to another embodiment of the present disclosure, and FIG. 14 is a view illustrating a state in which a cover is coupled to the chassis show in FIG. 13. A description the same as the description of the second coupling unit 200 according to the embodiment shown in FIGS. 2 to 12 will be omitted. In addition, the same reference numerals may be used for the same component or the similar component as those shown in FIGS. 2 to 12. A wire may correspond to a linear member 110 and a hook may correspond to a second coupling unit 200. A case in which the first coupling unit 100 is provided in a chassis 40 and the second coupling unit 200 is provided in a cover 30 will be described as an example.

As illustrated in FIGS. 13 and 14, the first coupling unit 100 may include a linear member 110 having the elasticity. The linear member 110 having the elasticity may include a wire made of metal material. In addition, the first coupling unit 100 may include a supporting part 120 configured to support the linear member 110.

During the first coupling unit 100 and the second coupling unit 200 are coupled to each other or in a state in which the first coupling unit 100 and the second coupling unit 200 are already coupled to each other, the linear member 110 of the first coupling unit 100 may be compressed by the second coupling unit 200 and supported by the supporting part 120 of the first coupling unit 100 thereby being elastically deformed.

The supporting part 120 may be integrally formed with the chassis 40 in which the first coupling unit 100 is provided. The first coupling unit 100 may be provided along an edge of the chassis 40. The first coupling unit 100 may be provided in plural, and a plurality of the first coupling unit 100 may be apart from each other. A part or all of the plurality of the first coupling unit 100 may be detachably coupled to the second coupling unit 200 provided in the cover 30. However, the arrangement of the plurality of the first coupling unit 100 is not limited thereto, and thus it may be modified.

Particularly, the supporting part 120 of the first coupling unit 100 may be provided in plural and a plurality of the supporting part 120 may be apart from each other along the edge of the chassis 40. One or more linear member 110 of the first coupling unit 100 may be provided and a single linear member 110 may be supported by the plurality of the supporting part 120.

The linear member 110 may include a coupling section in which the linear member 110 is coupled to the second coupling unit 200 and a supporting section the linear member 110 is supported by the supporting part 120, wherein the linear member 110 supported by the plurality of the supporting part 120 may include a plurality of coupling sections and a plurality of supporting sections. The supporting part 120 and the supporting section may be disposed on opposite sides with respect to the coupling section of the linear member 110.

The supporting part 120 of the first coupling unit 100 may include a first supporting part 121 supporting the linear member 110 in a direction opposite to a direction in which the linear member 110 is elastically deformed due to the coupling with the second coupling unit 200. The supporting part 120 of the first coupling unit 100 may include a second supporting part 122 supporting the linear member 110 in a direction opposite to a direction to which the second coupling unit 200 is coupled. In addition, the supporting part 120 of the first coupling unit 100 may include a third supporting part 123 supporting the linear member 110 in a direction opposite to a direction from which the second coupling unit 200 is separated after the second coupling unit 200 is coupled.

When a coupling direction in which the first coupling unit 100 and the second coupling unit 200 are coupled to each other is defined as a vertical direction, the second coupling unit 200 may compress the linear member 110 from one side of the linear member 110 to a horizontal direction that is perpendicular to the coupling direction of the first coupling unit 100 and the second coupling unit 200, due to the coupling of the linear member 110 and the second coupling unit 200. In this time, the linear member 110 may be elastically deformed by the first supporting part 121 and then compress the second coupling unit 200 by the restoring force.

Further, when the coupling direction of the first coupling unit 100 and the second coupling unit 200 is defined as a vertical direction, the second supporting part 122 may support the linear member 110 so that the elastic deformation of the linear member 110 in a vertically downward direction is not large during the linear member 110 and the second coupling unit 200 are coupled to each other. The third supporting part 123 may support the linear member 110 so that the elastic deformation of the linear member 110 in a vertically upward direction is not large after the linear member 110 and the second coupling unit 200 are coupled to each other.

As mentioned above, it may be required that the elastic deformation of the linear member 110 is not large in the vertical up and down direction in which the first coupling unit 100 and the second coupling unit 200 are coupled to each other and the elastic deformation of the linear member 110 may be needed to be sufficient. Accordingly, the first supporting part 121 may be needed to be disposed in the farthest position from the coupling section of the linear member 110 to which the second coupling unit 200 is coupled, in comparison with the second supporting part 122 and the third supporting part 123.

Referring to FIGS. 13 and 14, the edge of the chassis 40 may be formed in a horizontal plane. The first coupling unit 100 may be protruded from the horizontal plane of the chassis 40. Particularly, the first supporting part 121 and the third supporting part 123 may be integrally formed with each other, and the first supporting part 121 and the third supporting part 123 may be protruded from the horizontal plane of the chassis 40.

The first supporting part 121 and the third supporting part 123, which are integrally formed with each other, may be formed in a tunnel shape through which the linear member 110 is passed, and an end portion of the third supporting part 123 may be formed to have a width in the horizontal direction be wider than an end portion in the side of the first supporting part 121 for the elastic deformation of the linear member 110 in the horizontal direction.

The first coupling unit 100 may include a through hole 140 so that the second coupling unit 200 is passed through the first coupling unit 100. The through hole 140 may be provided in the chassis 40 to correspond to the coupling section of the linear member 110. The second supporting part 122 may be provided between the third supporting part 123 integrally formed with the first supporting part 121 and the through hole 140.

Although not shown in the drawings, the first coupling unit 100 may be formed on a rear surface of the chassis 40 i.e. an opposite surface to a surface to which the cover 30 is coupled.

Further, although not shown in the drawings, the through hole 140 through which the second coupling unit 200 is passed may be not provided on the chassis 40, but entire of the supporting part 120 including the first supporting part 121, the second supporting part 122 and the third supporting part 123 may be protruded from the chassis 40. Since the supporting part 120 is protruded from the chassis 40, a space to which the second coupling unit 200 is coupled may be secured.

The linear member 110 may include a locking part 111 so that the linear member 110 is prevented from being separated from the chassis 40 in a longitudinal direction of the linear member 110. The locking part 111 may be provided on one end portion in the longitudinal direction of the linear member 110, and formed such that the linear member 110 is bent. When the linear member 110 is coupled to the chassis 40 in an upper and lower direction, the locking part 111 may be needed to be provided on an upper end portion of the linear member 110.

The first coupling unit 100 may include a connector 130 to which the locking part 111 of the linear member 110 is coupled. The connector 130 may be provided together with the supporting part 120 of the first coupling unit 100. The connector 130 may be needed to be formed with the first supporting part 121 provided on the most outside among the first supporting part 121, the second supporting part 122 and the third supporting part 123.

When a single linear member 110 is supported by the plurality of the supports 120, the connector 130 may be provided only the first coupling unit 100 supporting the end portion of the linear member 110 in which the locking part 111 is provided, or alternatively may be provided in the chassis 40 aside from the first coupling unit 100.

Hereinafter a first coupling unit according to another embodiment of the present disclosure will be described.

Figure 15:
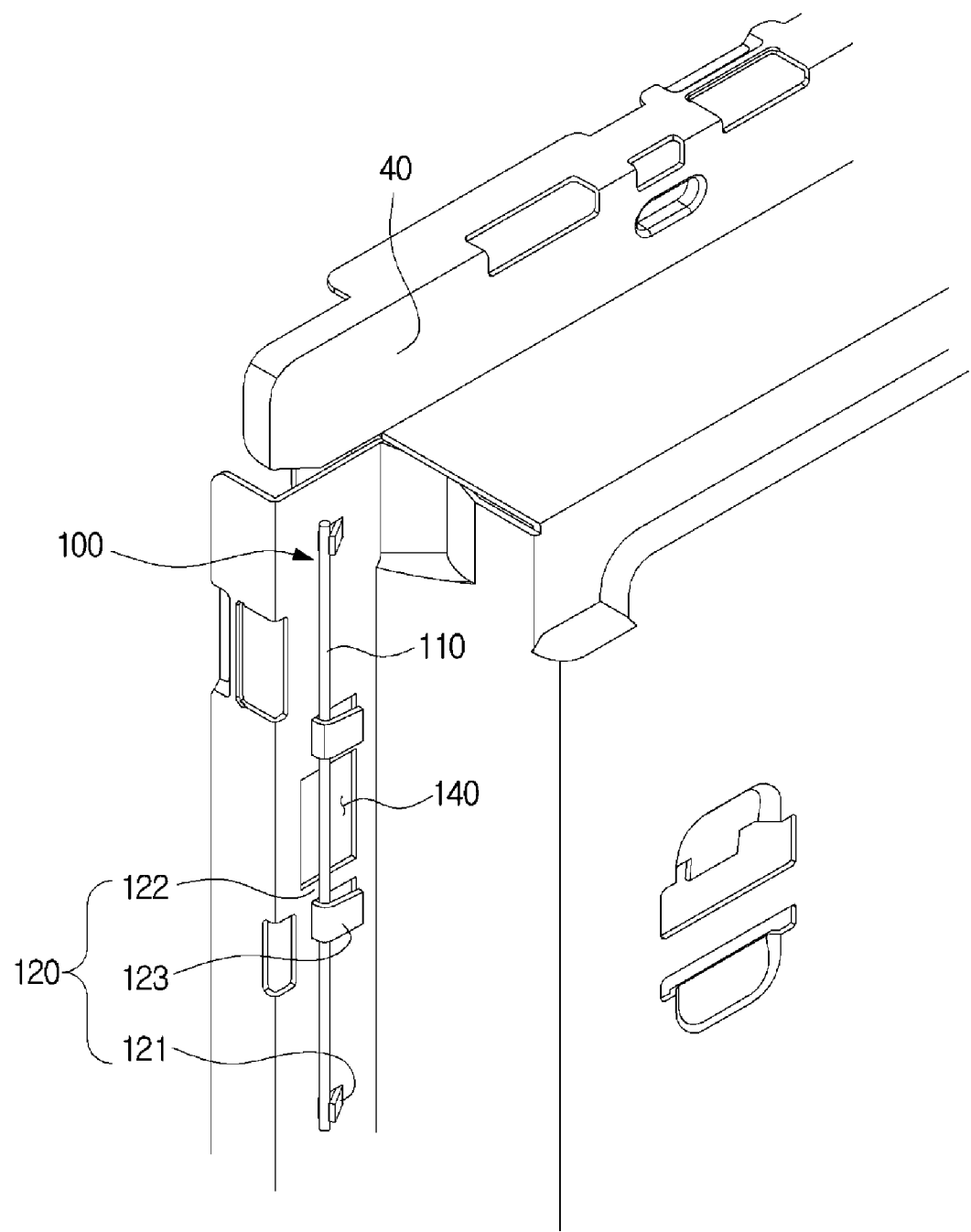
FIG. 15 is a partial enlarged view illustrating a chassis in a display apparatus according to another embodiment of the present disclosure.
Figure 16:
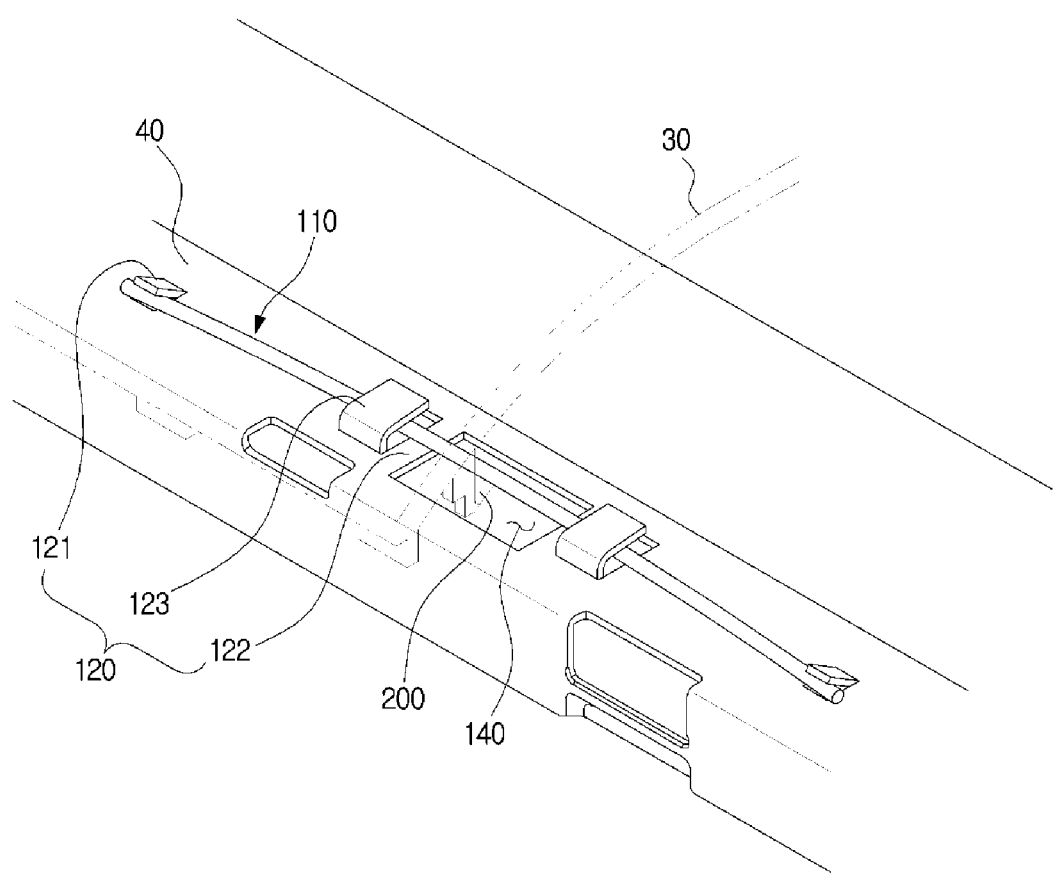
FIG. 16 is a view illustrating a state in which a cover is coupled to the chassis show in FIG. 15.

FIG. 15 is a partial enlarged view illustrating a chassis in a display apparatus according to another embodiment of the present disclosure, and FIG. 16 is a view illustrating a state in which a cover is coupled to the chassis show in FIG. 15. A description the same as the description of the second coupling unit 200 according to the embodiment shown in FIGS. 2 to 12 will be omitted. In addition, the same reference numerals may be used for the same component or the similar component as those shown in FIGS. 2 to 12. A wire may correspond to a linear member 110 and a hook may correspond to a second coupling unit 200. A case in which the first coupling unit 100 is provided in a chassis 40 and the second coupling unit 200 is provided in a cover 30 will be described as an example.

As illustrated in FIGS. 15 and 16, the first coupling unit 100 may include a linear member 110 having the elasticity. The linear member 110 having the elasticity may include a wire made of metal material. In addition, the first coupling unit 100 may include a supporting part 120 configured to support the linear member 110.

During the first coupling unit 100 and the second coupling unit 200 are coupled to each other or in a state in which the first coupling unit 100 and the second coupling unit 200 are already coupled to each other, the linear member 110 of the first coupling unit 100 may be compressed by the second coupling unit 200 and supported by the supporting part 120 of the first coupling unit 100 thereby being elastically deformed.

The supporting part 120 may be integrally formed with the chassis 40 in which the first coupling unit 100 is provided. The first coupling unit 100 may be provided along an edge of the chassis 40. The first coupling unit 100 may be provided in plural, and a plurality of the first coupling unit 100 may be apart from each other. Some or all of the plurality of the first coupling unit 100 may be detachably coupled to the second coupling unit 200 provided in the cover 30. However, the arrangement of the plurality of the first coupling unit 100 is not limited thereto, and thus it may be modified.

Although not shown in the drawings, the supporting part 120 of the first coupling unit 100 may be provided in plural and a plurality of the supporting part 120 may be apart from each other along the edge of the chassis 40. One or more linear member 110 of the first coupling unit 100 may be provided and a single linear member 110 may be supported by the plurality of the supporting part 120.

The linear member 110 may include a coupling section in which the linear member 110 is coupled to the second coupling unit 200 and a supporting section supported by the supporting part 120, wherein the linear member 110 supported by the plurality of the supporting part 120 may include a plurality of coupling sections and a plurality of supporting sections. The supporting part 120 and the supporting section may be disposed on opposite sides with respect to the coupling section of the linear member 110.

As illustrated in FIGS. 15 and 16, the supporting part 120 of the first coupling unit 100 may include a first supporting part 121 supporting the linear member 110 in a direction opposite to a direction in which the linear member 110 is elastically deformed due to the coupling with the second coupling unit 200. The supporting part 120 of the first coupling unit 100 may include a second supporting part 122 supporting the linear member 110 in a direction opposite to a direction to which the second coupling unit 200 is coupled. In addition, the supporting part 120 of the first coupling unit 100 may include a third supporting part 123 supporting the linear member 110 in a direction opposite to a direction from which the second coupling unit 200 is separated after the second coupling unit 200 is coupled.

When a coupling direction in which the first coupling unit 100 and the second coupling unit 200 are coupled to each other is defined as a vertical direction, the second coupling unit 200 may compress the linear member 110 from one side of the linear member 110 to a horizontal direction that is perpendicular to the coupling direction of the first coupling unit 100 and the second coupling unit 200, due to the coupling of the linear member 110 and the second coupling unit 200. In this time, the linear member 110 may be elastically deformed by the first supporting part 121 and then compress the second coupling unit 200 by the restoring force.

Further, when the coupling direction of the first coupling unit 100 and the second coupling unit 200 is defined as a vertical direction, the second supporting part 122 may support the linear member 110 so that the elastic deformation of the linear member 110 in a vertically downward direction is not large during the linear member 110 and the second coupling unit 200 are coupled to each other. The third supporting part 123 may support the linear member 110 so that the elastic deformation of the linear member 110 in a vertically upward direction is not large after the linear member 110 and the second coupling unit 200 are coupled to each other.

As mentioned above, it may be required that the elastic deformation of the linear member 110 is not large in the vertical up and down direction in which the first coupling unit 100 and the second coupling unit 200 are coupled to each other and the elastic deformation of the linear member 110 is sufficient. Accordingly, the first supporting part 121 may be needed to be disposed in the farthest position from the coupling section of the linear member 110 to which the second coupling unit 200 is coupled, in comparison with the second supporting part 122 and the third supporting part 123.

Referring to FIGS. 15 and 16, the edge of the chassis 40 may be formed in a horizontal plane. The first coupling unit 100 may be protruded from the horizontal plane of the chassis 40. Particularly, the first supporting part 121 and the third supporting part 123 may be protruded from the horizontal plane of the chassis 40.

The first coupling unit 100 may include a through hole 140 so that the second coupling unit 200 is passed through the first coupling unit 100. The through hole 140 may be provided in the chassis 40 to correspond to the coupling section of the linear member 110. The second supporting part 122 may be provided between the third supporting part 123 and the through hole 140.

Although not shown in the drawings, the first coupling unit 100 may be formed on a rear surface of the chassis 40 i.e. an opposite surface to a surface to which the cover 30 is coupled.

Further, although not shown in the drawings, the through hole 140 through which the second coupling unit 200 is passed may be not provided on the chassis 40, but entire of the supporting part 120 including the first supporting part 121, the second supporting part 122 and the third supporting part 123 may be protruded from the chassis 40. Since the supporting part 120 is protruded from the chassis 40, a space to which the second coupling unit 200 is coupled may be secured.

Although not shown in the drawings, the linear member 110 may include a locking part 111 to prevent the linear member 110 from being separated from the chassis 40 in a longitudinal direction of the linear member 110. The locking part 111 may be provided on one end portion in the longitudinal direction of the linear member 110, and formed such that the linear member 110 is bent. When the linear member 110 is coupled to the chassis 40 in an upper and lower direction, the locking part 111 may be needed to be provided on an upper end portion of the linear member 110.

The first coupling unit 100 may include a connector 130 to which the locking part 111 of the linear member 110 is coupled. The connector 130 may be provided together with the supporting part 120 of the first coupling unit 100. The connector 130 may be needed to be formed with the first supporting part 121 provided on the most outside among the first supporting part 121, the second supporting part 122 and the third supporting part 123.

When a single linear member 110 is supported by the plurality of the supports 120, the connector 130 may be provided only the first coupling unit 100 supporting the end portion of the linear member 110 in which the locking part 111 is provided, or alternatively may be provided in the chassis 40 aside from the first coupling unit 100.

The above mentioned coupling structure between the first coupling unit 100 and the second coupling unit 200 may be applied for the coupling between the other components of the display apparatus 1 as well as for the coupling between the chassis 40 and the cover 30 of the display apparatus 1. Further the coupling structure may be applied to all kinds of electronics including a display apparatus.

As is apparent from the above description, according to the proposed display apparatus, the use of the screw used in a conventional assembly process may be reduced by assembling the display apparatus using the wire and the hook, and thus the increase of production cost and time caused by the use of the screw may be reduced.

When using the wire and hook instead of the screw in the assembly process, the display apparatus having a slim design may be implemented because the display apparatus does not need to have a thickness as much as a thread height.

Since it does not require a separate tool for the assembly of the display apparatus, as well as the assembly, the disassembly or the reassembly of the display apparatus for the maintenance may be easily performed.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
   a chassis configured to support a display module and having an edge disposed within a first plane;
   a cover having an edge disposed within a second plane parallel to the first plane, and being movable relative to the chassis in a coupling direction perpendicular to the first and second planes to be detachably coupled to the chassis;
   a first coupling unit on one of the chassis and the cover and adjacent to the edge of the one of the chassis and the cover, and including a linear member having an elasticity, and first and second locking parts respectively attaching first and second ends of the linear member to the one of the chassis and the cover so that the linear member is tensioned at a fixed position on the one of the chassis and the cover; and
   a second coupling unit on the other of the chassis and the cover and adjacent to the edge of the other of the chassis and the cover, and having a coupling guide surface and a coupling part that form a hook projecting away from the edge of the other of the chassis and the cover, the second coupling unit being detachably coupleable to the linear member by movement of the cover in the coupling direction so that, when the second coupling unit is coupled to the linear member, the coupling guide surface compresses, and thereby elastically deforms, the linear member due to the elasticity of the linear member, and thereafter the linear member is elastically restored to engage the coupling part, wherein the first coupling unit includes a supporting part including:

a first supporting part extending from the one of the chassis and the cover, having an abutment surface, facing in a direction toward the edge of one of the chassis and the cover, configured to engage the linear member and thereby support the linear member at the fixed position in a direction opposite to a direction in which the linear member is elastically deformed by the coupling guide surface, a second supporting part extending from the one of the chassis and the cover, having an abutment surface, facing toward the other of the chassis and the cover, configured to engage the linear member and thereby support the linear member at the fixed position in a direction opposite to a direction in which the second coupling unit is movable to couple the second coupling unit to the linear member, and a third supporting part extending from the one of the chassis and the cover, having an abutment surface, facing the one of the chassis and the cover, configured to engage the linear member and thereby support the linear member at the fixed position in a direction opposite to a direction in which the second coupling unit is movable to detach the second coupling unit from the linear member.

2. The display apparatus of claim 1, wherein the linear member includes:

a coupling section in which the linear member and the second coupling unit are coupleable to each other, and a supporting section in which the linear member is supported by the supporting part, wherein at least one of the first supporting part, the second supporting part and the third supporting part is disposed on opposite sides with respect to the coupling section of the linear member, and the first supporting part is disposed in the farthest position from the coupling section.

3. The display apparatus of claim 1, wherein the first coupling unit includes a first connector to which the first locking part is connected, and a second connector to which the second locking part is connected.

4. The display apparatus of claim 1, wherein the linear member is disposed in a vertical direction with respect to a display orientation of the display apparatus.

5. The display apparatus of claim 1, wherein the linear member is disposed in a horizontal direction with respect to a display orientation of the display apparatus.

6. The display apparatus of claim 1, wherein
the linear member is comprised of a metal material, and the cover is comprised of a plastic material.

7. A display apparatus comprising:
a chassis configured to support a display module and having an edge disposed within a first plane;
a wire having an elasticity;
first and second locking parts respectively attaching first and second ends of the wire to the chassis adjacent to the edge of the chassis so that the wire is tensioned at a fixed position on the chassis;
a cover having an edge disposed within a second plane parallel to the first plane, and being movable relative to the chassis in a coupling direction perpendicular to the first and second planes to be coupled to the chassis;
a hook, having a coupling guide surface and a coupling part, on the cover adjacent to the edge of the cover and projecting away from the edge of the cover, the hook being detachably coupleable to the wire by the movement of the cover in the coupling direction so that, when the hook is coupled to the wire, the coupling guide surface of the hook compresses, and thereby elastically deforms, the wire due to the elasticity of the wire, and thereafter the wire is elastically restored to engage the coupling part of the hook;
a first supporting part, on the chassis and extending from the chassis, having an abutment surface, facing in a direction toward the edge of the chassis, configured to engage the wire and thereby support the wire at the fixed position in a direction opposite to a direction in which the wire is elastically deformed by the coupling guide surface;
a second supporting part, on the chassis and extending from the chassis, having an abutment surface, facing toward the cover, configured to engage the wire and thereby support the wire at the fixed position in a direction opposite to a direction in which the hook is movable to couple the hook to the wire, and
a third supporting part, on the chassis and extending from the chassis, having an abutment surface, facing the chassis, configured to engage the wire and thereby support the wire at the fixed position in a direction opposite to a direction in which the hook is movable to detach the hook from the wire.

8. The display apparatus of claim 7, wherein:
the hook includes a detaching guide part to allow the hook to be detached from the wire.

9. The display apparatus of claim 7, wherein the chassis includes a first connector to which the first locking part is connected, and a second connector to which the second locking part is connected.

* * * * *